United States Patent
Wang

(10) Patent No.: US 10,861,628 B2
(45) Date of Patent: Dec. 8, 2020

(54) FRONT ASSEMBLY SLIDING STRUCTURE, CONTROLLING DEVICE THEREOF, AND TERMINAL HAVING SAME

(71) Applicant: Beijing Xiaomi Mobile Software Co., Ltd., Beijing (CN)

(72) Inventor: Yuwen Wang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 238 days.

(21) Appl. No.: 16/227,361

(22) Filed: Dec. 20, 2018

(65) Prior Publication Data
US 2020/0020470 A1     Jan. 16, 2020

(30) Foreign Application Priority Data
Jul. 16, 2018   (CN) .......................... 2018 1 0776244

(51) Int. Cl.
*H01F 7/06*        (2006.01)
*F16C 29/02*       (2006.01)
(Continued)

(52) U.S. Cl.
CPC ............. *H01F 7/064* (2013.01); *F16C 29/02* (2013.01); *G01D 5/145* (2013.01); *H01F 7/02* (2013.01); *H01F 7/20* (2013.01); *H05K 5/03* (2013.01)

(58) Field of Classification Search
CPC ... H01F 7/064; H01F 7/20; H01F 7/06; H01F 7/02; F16C 29/02; G01D 5/145;
(Continued)

(56) References Cited

U.S. PATENT DOCUMENTS

| 2008/0174392 A1 | 7/2008 | Cho |
| 2014/0092535 A1 | 4/2014 | Chou et al. |

(Continued)

FOREIGN PATENT DOCUMENTS

| CN | 108234700 A | 6/2018 |
| KR | 10-2005-0020313 A | 3/2005 |

(Continued)

OTHER PUBLICATIONS

Korean Office Action dated Feb. 27, 2020, in counterpart Korean Application No. 10-2018-7037507.
(Continued)

*Primary Examiner* — Adolf D Berhane
(74) *Attorney, Agent, or Firm* — Finnegan, Henderson, Farabow, Garrett & Dunner, L.L.P.

(57) ABSTRACT

A front assembly sliding structure includes: a front slider provided with a first magnetic body, and a second magnetic body disposed on a panel. The front slider is slidable relative to the panel, and the first magnetic body is opposite to the second magnetic body when the front slider is in a first position. The front slider is configured to slide from the first position to a second position when a force in a first direction is present between the first magnetic body and the second magnetic body, and configured to slide from the second position to the first position when a force in a second direction is present between the first magnetic body and the second magnetic body, the first direction being opposite to the second direction.

20 Claims, 8 Drawing Sheets

(51) Int. Cl.
*G01D 5/14* (2006.01)
*H01F 7/02* (2006.01)
*H01F 7/20* (2006.01)
*H05K 5/03* (2006.01)

(58) Field of Classification Search
CPC ......... G01D 5/14; H05K 5/03; H04M 1/0245; H04M 2250/12; G06F 1/1624
See application file for complete search history.

(56) References Cited

U.S. PATENT DOCUMENTS

| | | | | |
|---|---|---|---|---|
| 2016/0182697 | A1* | 6/2016 | Fields | H04R 5/02 381/300 |
| 2017/0077394 | A1* | 3/2017 | Saida | H01L 43/08 |
| 2017/0164080 | A1* | 6/2017 | Chung | H04R 1/028 |
| 2017/0237884 | A1 | 8/2017 | Evans, V et al. | |
| 2020/0141993 | A1* | 5/2020 | Nikic | G03G 13/025 |

FOREIGN PATENT DOCUMENTS

| | | |
|---|---|---|
| KR | 10-2006-0016037 A | 2/2006 |
| KR | 20-0414536 Y1 | 4/2006 |
| KR | 10-0819814 B1 | 4/2008 |
| KR | 10-2017-0000738 A | 1/2017 |

OTHER PUBLICATIONS

Extended European Search Report dated Jul. 18, 2019, in counterpart European Patent Application No. 19155707.3-1221.
International Search Report issued by the State Intellectual Property Office (SIPO) of the People's Republic of China (PRC) dated Apr. 17, 2019, in counterpart International Application No. PCT/CN2018/109762.

* cited by examiner

FRONT ASSEMBLY SLIDING STRUCTURE, CONTROLLING DEVICE THEREOF, AND TERMINAL HAVING SAME

CROSS-REFERENCE TO RELATED APPLICATIONS

This application claims priority to Chinese Patent Application No. 201810776244.7, filed Jul. 16, 2018, the entire content of which is incorporated herein by reference.

TECHNICAL FIELD

The present disclosure generally relates to the field of computer technology, and more particularly, to a front assembly sliding structure, a controlling method, apparatus and device thereof, a terminal having the same and a storage medium.

BACKGROUND

When a terminal includes a display screen and front elements, the front elements and the display screen are commonly disposed on a front panel of the terminal. The front elements may include a front camera, a receiver, a proximity sensor, an ambient light sensor, etc.

Restricted by a conventional process and technology, the front elements may not be made very small, which will affect a screen ratio of the terminal, such as an all-screen, where the screen ratio refers to an area ratio of the display screen to the front panel, and the all-screen refers to a screen with the screen ratio close to 100%.

SUMMARY

According to a first aspect of embodiments of the present disclosure, there is provided a front assembly sliding structure, including: a front slider provided with a first magnetic body, and a second magnetic body disposed on a panel. The front slider is slidable relative to the panel, and the first magnetic body is opposite to the second magnetic body when the front slider is in a first position. The front slider is configured to slide from the first position to a second position when a force in a first direction is present between the first magnetic body and the second magnetic body, and configured to slide from the second position to the first position when a force in a second direction is present between the first magnetic body and the second magnetic body, the first direction being opposite to the second direction.

According to a second aspect of embodiments of the present disclosure, there is provided a terminal, including: a front panel provided with a display screen, a rear panel provided with a mainboard, and a front assembly sliding structure as described in the first aspect of embodiments of the present disclosure. The front assembly sliding structure is connected to the front panel and the rear panel, respectively; the first position is a position where a front element in the front slider is shielded by the front panel; and the second position is a position where the front element in the front slider is not shielded by the front panel.

According to a third aspect of embodiments of the present disclosure, there is provided a controlling method of a front assembly sliding structure, used in the terminal as described in the second aspect of embodiments of the present disclosure, including: receiving a control instruction; controlling that a force in the first direction is present between the first magnetic body and the second magnetic body according to the control instruction, so as to enable the front slider to slide from the first position to the second position; and controlling that a force in the second direction is present between the first magnetic body and the second magnetic body according to the control instruction, so as to enable the front slider to slide from the second position to the first position. The first direction is opposite to the second direction; the first position is a position where the front element in the front slider is shielded by the front panel; and the second position is a position where the front element in the front slider is not shielded by the front panel.

According to a fourth aspect of embodiments of the present disclosure, there is provided a controlling apparatus of a front assembly sliding structure, used in the terminal as described in the second aspect of embodiments of the present disclosure, including: a receiving module configured to receive a control instruction; a controlling module configured to control that a force in the first direction is present between the first magnetic body and the second magnetic body according to the control instruction received by the receiving module, so as to enable the front slider to slide from the first position to the second position; and also configured to control that a force in the second direction is present between the first magnetic body and the second magnetic body according to the control instruction received by the receiving module, so as to enable the front slider to slide from the second position to the first position. The first direction is opposite to the second direction; the first position is a position where the front element in the front slider is shielded by the front panel; and the second position is a position where the front element in the front slider is not shielded by the front panel.

According to a fifth aspect of embodiments of the present disclosure, there is provided a controlling device of a front assembly sliding structure, used in the terminal as described in the second aspect of embodiments of the present disclosure, including: a processor; and a memory for storing instructions executable by the processor. The processor is configured to: receive a control instruction; control that a force in the first direction is present between the first magnetic body and the second magnetic body according to the control instruction, so as to enable the front slider to slide from the first position to the second position; control that a force in the second direction is present between the first magnetic body and the second magnetic body according to the control instruction, so as to enable the front slider to slide from the second position to the first position. The first direction is opposite to the second direction; the first position is a position where the front element in the front slider is shielded by the front panel; and the second position is a position where the front element in the front slider is not shielded by the front panel.

According to a sixth aspect of embodiments of the present disclosure, there is provided a computer-readable storage medium having stored therein at least one instruction, at least one program, a code set or an instruction set, in which the at least one instruction, the at least one program, the code set or the instruction set are loaded and executed by a processor to implement the controlling method of a front assembly sliding structure as described in the third aspect of embodiments of the present disclosure.

It should be appreciated that, the general description hereinbefore and the detail description hereinafter are explanatory and illustrative, and shall not be construed to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to embodiments, examples of which are illustrated in the accompanying drawings. The following description refers to the accompanying drawings in which the same numbers in different drawings represent the same or similar elements unless otherwise represented. The implementations set forth in the following description of embodiments do not represent all implementations consistent with the present disclosure. Instead, they are merely examples of apparatuses and methods consistent with aspects related to the present disclosure as recited in the appended claims.

Figure 1:
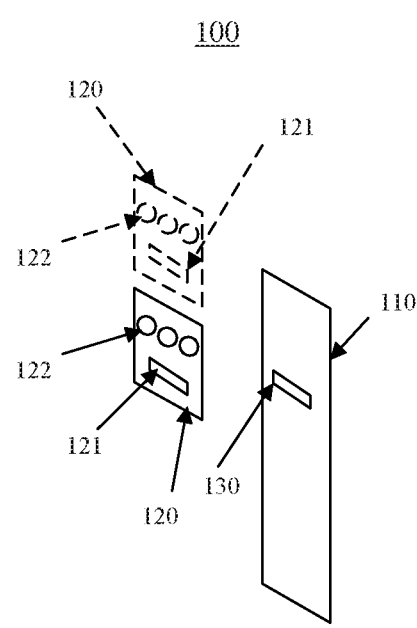
FIG. 1 is a schematic diagram of a front assembly sliding structure according to an embodiment of the present disclosure.

FIG. 1 is a schematic diagram of a front assembly sliding structure 100 according to an embodiment of the present disclosure. As illustrated in FIG. 1, the front assembly sliding structure 100 includes: a front slider 120 provided with a first magnetic body 121, and a second magnetic body 130 disposed on a panel 110. The front slider 120 is slidable relative to the panel 110. The first magnetic body 121 is opposite to the second magnetic body 130 when the front slider 120 is in a first position as described below.

The front slider 120 is configured to slide from the first position to a second position, as described below, when a force in a first direction is present between the first magnetic body 121 and the second magnetic body 130, and configured to slide from the second position to the first position when a force in a second direction is present between the first magnetic body 121 and the second magnetic body 130. The first direction is opposite to the second direction.

The front slider 120 may further include a front element 122, and the front element 122 may include at least one of a front camera, a receiver, a proximity sensor, an ambient light sensor, or other components, which will not be limited in the present disclosure. For illustrative porpoises only, FIG. 1 shows that the front slider 120 includes three front elements 122.

The first position may be a position of the front slider 120 when the front element 122 is located outside a terminal, and the second position may be a position of the front slider 120 when the front element 122 is located inside the terminal. Alternatively, the first position may be a position of the front slider 120 when the front element 122 is located inside a terminal, and the second position is a position of the front slider 120 when the front element 122 is located outside the terminal. The first position and the second position will not be limited herein.

In exemplary embodiments, the first magnetic body 121 is opposite to the second magnetic body 130 when the front slider 120 is in the first position. For example, as shown in FIG. 1, if a position of the front slider 120 represented by a solid line is the first position, and a position of the front slider 120 represented by a dotted line is the second position, the second magnetic body 130 is located at a position shown in FIG. 1; if the position of the front slider 120 represented by the dotted line is the first position, and the position of the front slider 120 represented by the solid line is the second position, the second magnetic body 130 is located above the position shown in FIG. 1 (not shown in FIG. 1).

In the illustrated embodiment, by disposing the front element on the front slider, the front assembly sliding structure controls the position of the front element by controlling the slide of the front slider. For example, when the front element needs to be used, the front element is controlled to be located at the second position where the front element is not shielded by a front panel, so as to ensure the normal use of the front element. When the front element does not need to be used, the front element is controlled to be located at the first position where the front element is shielded by the front panel, without fixing the front element in the front panel of a terminal, thereby increasing a screen ratio of a display screen in the front panel.

Figure 2:
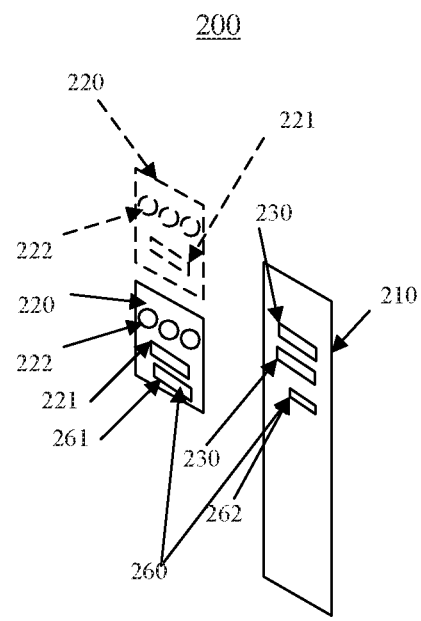
FIG. 2 is a schematic diagram of a front assembly sliding structure according to an embodiment of the present disclosure.

FIG. 2 is a schematic diagram of a front assembly sliding structure 200 according to an embodiment of the present disclosure. As illustrated in FIG. 2, the front assembly sliding structure 200 includes: a front slider 220 provided with a first magnetic body 221, and a second magnetic body 230 disposed on a panel 210. The front slider 220 is slidable relative to the panel 210. The first magnetic body 221 is opposite to the second magnetic body 230 when the front slider 220 is in a first position as described below.

In one embodiment, the first magnetic body 221 is an electromagnet, and the second magnetic body 230 includes a first magnet and a second magnet disposed side by side in a predetermined direction. In another embodiment, the first magnetic body 221 includes a first magnet and a second magnet disposed side by side in a predetermined direction, and the second magnetic body 230 is an electromagnet. The predetermined direction is a first direction or a second direction; and a magnetism of a pole of the first magnet facing the electromagnet is opposite to that of a pole of the second magnet facing the electromagnet.

Figure 3:
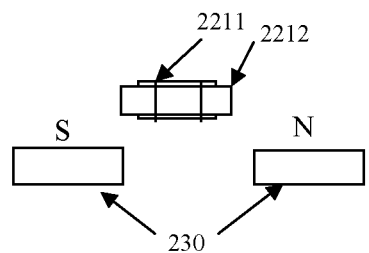
FIG. 3 is a side view of a terminal according to an embodiment of the present disclosure.

The electromagnet is a component that generates a magnetic field when energized. For example, as shown in FIG. 3, the electromagnet, as the first magnetic body 221 (FIG. 2), may include a soft magnetic body 2211 and a coil 2212 wound outside the soft magnetic body 2211. When the coil 2212 is energized, the soft magnetic body 2211 is magnetized, and has magnetism thereby. Poles of the electromagnet are related to a direction of a current in the coil 2212. Assuming that a pole at an end of the electromagnet is a north pole (N pole) when the coil 2212 is energized by a forward current, if the coil 2212 is energized by a reverse current, the pole at the same end of the electromagnet will be a south pole (S pole).

In some embodiments, the electromagnet may be connected to a mainboard of a terminal, by which power is supplied to the coil 2212 of the electromagnet.

Referring back to FIG. 2, the predetermined direction is the first direction or the second direction. The first direction is a sliding direction of the front slider 220 from an inside of the terminal to an outside of the terminal, the second direction is a sliding direction of the front slider 220 from the outside of the terminal to the inside of the terminal, and the first direction is opposite to the second direction.

If a three-dimensional coordinate is established with a center of the terminal as an origin, an x-axis parallel to a bottom edge of the terminal, a y-axis parallel to a side edge of the terminal and a z-axis perpendicular to a plane where the terminal is located, if the front slider 220 is extensible or retractable from a top of the terminal, the first direction and the second direction are a direction of the y-axis; if the front slider 220 is extensible or retractable from the side edge of the terminal, the first direction and the second direction are a direction of the x-axis.

The first magnet and the second magnet may be permanent magnets, and the magnetism of the pole of the first magnet facing the electromagnet is opposite to that of the pole of the second magnet facing the electromagnet. For example, the pole of the first magnet facing the electromagnet is an N pole, and the pole of the second magnet facing the electromagnet is an S pole. Alternatively, the pole of the first magnet facing the electromagnet is an S pole, and the pole of the second magnet facing the electromagnet is an N pole. As an example, FIG. 3 shows a side view of a terminal where the first magnet is at a right side, the second magnet is at a left side, the pole of the first magnet facing the electromagnet is the N pole, and the pole of the second magnet facing the electromagnet is the S pole.

In an embodiment, when a force in the first direction is present between the first magnetic body 221 and the second magnetic body 230, the front slider 220 is slidable from the first position to the second position; when a force in the second direction is present between the first magnetic body 221 and the second magnetic body 230, the front slider 220 is slidable from the second position to the first position. Explanations of the first position and the second position are described in detail in embodiments with reference to FIG. 1, and will not be elaborated herein.

In an embodiment, the first position is a position where a front element 222 in the front slider 220 is shielded by the panel 210; and the second position is a position where the front element 222 in the front slider 220 is not shielded by the panel 210, and the front element 222 is directly facing a user of the terminal. That is, when the force in the first direction is present between the first magnetic body 221 and the second magnetic body 230, the front slider 220 is slidable from the inside of the terminal to the outside of the terminal; when the force in the second direction is present between the first magnetic body 221 and the second magnetic body 230, the front slider 220 is slidable from the outside of the terminal to the inside of the terminal.

In the illustrated embodiment in FIG. 2, the position of the front slider 220 represented by the solid line is the first position, and the position of the front slider 220 represented by the dotted line is the second position.

A generation process of the force between the first magnetic body 221 and the second magnetic body 230 will be described in detail below.

For example, when the electromagnet is magnetized by a current in a third direction, an attraction in the first direction is present between the electromagnet and the first magnet, a repulsion in the first direction is present between the electromagnet and the second magnet, and the attraction and the repulsion in the first direction are the force in the first direction. Also for example, when the electromagnet is magnetized by a current in a fourth direction, a repulsion in the second direction is present between the electromagnet and the first magnet, an attraction in the second direction is present between the electromagnet and the second magnet, the fourth direction is opposite to the third direction, and the attraction and the repulsion in the second direction are the force in the second direction.

The current may be generated by the terminal as needed according to the scenarios. For example, when the user picks up an incoming call, the terminal determines that the user needs to use the receiver in the front slider 220, and generates the current in the third direction to control the front slider 220 to slide to expose the receiver for the user to use. For another example, when the user wants to take a selfie, the terminal determines that the user needs to use the front camera in the front slider 220, and generates the current in the third direction to control the front slider 220 to slide to expose the front camera for the user to use. The current may also be generated by the terminal after receiving an instruction. For example, the terminal may receive the instruction such as a voice, a gesture or a text, and controls the front slider 220 to slide according to the instruction. Modes for triggering the terminal to generate the current are not limited herein.

When the front slider 220 is slid to the second position, the electromagnet is attached to the first magnet, and the current in the third direction is turned off; when the front slider 220 is slid to the first position, the electromagnet is attached to the second magnet, and the current in the fourth direction is turned off. Reference can be made to a side view of a terminal shown in FIG. 4 or FIG. 5, where the front slider shown in FIG. 4 is in the second position, and the front slider shown in FIG. 5 is in the first position.

Figure 4:
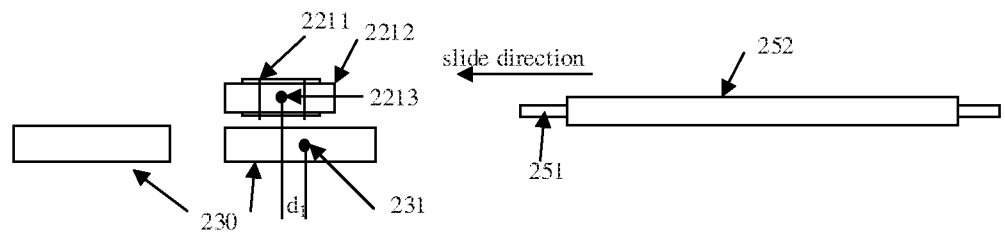
FIG. 4 is a side view of a terminal according to an embodiment of the present disclosure.

When the electromagnet (including the soft magnetic body 2211 and the coil 2212) is attached to the first magnet, as shown in FIG. 4, if a central position 2213 of the electromagnet is aligned to a central position 231 of the first magnet, a repulsion of the first magnet to the electromagnet is in a direction of the z-axis, which does not drive the electromagnet to slide in the second direction during a sliding process of the electromagnet from the second position to the first position, and thus does not drive the front slider to slide in the second direction. The central position 2213 of the electromagnet needs to be at a second predetermined distance $d_1$ from the central position 231 of the first magnet, such that the attraction in the first direction and the repulsion in the second direction can be generated between the first magnet and the electromagnet. The second predetermined distance $d_1$ may be calculated according to a preset formula, or may be obtained based on empirical values, which will not be limited in the present disclosure. In some embodiments, the second predetermined distance $d_1$ is in a range of 0.3 mm to 0.5 mm.

Figure 5:
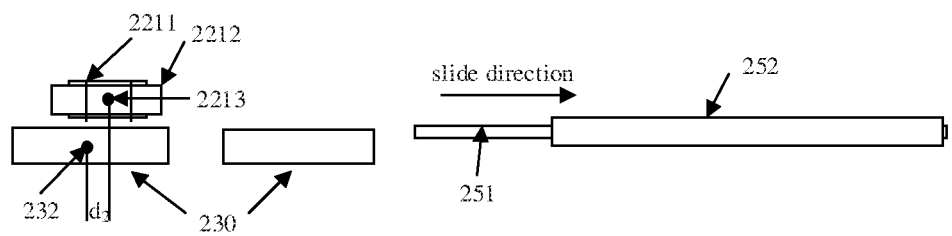
FIG. 5 is a side view of a terminal according to an embodiment of the present disclosure.

Similarly, the central position 2213 of the electromagnet needs to be at a first predetermined distance $d_2$ from a central position 232 of the second magnet, as shown in FIG. 5, such that the repulsion in the first direction and the attraction in the second direction can be generated between the second magnet and the electromagnet. The first predetermined distance $d_2$ may be calculated according to a preset formula, or may be obtained based on empirical values, which will not be limited in the present disclosure. In some embodiments, the first predetermined distance $d_2$ is in a range of 0.3 mm to 0.5 mm. The first predetermined distance $d_2$ may be equal or not equal to the second predetermined distance $d_1$, which will not be limited herein.

Accordingly, when the front slider is in the first position, the electromagnet is attached to the second magnet, and the central position of the electromagnet is at the first predetermined distance from the central position of the second magnet; when the front slider is in the second position, the electromagnet is attached to the first magnet, and the central position of the electromagnet is at the second predetermined distance from the central position of the first magnet.

In an embodiment, a distance between the central position 231 of the first magnet and the central position 232 of the second magnet is less than a predetermined threshold. The predetermined threshold may be calculated according to a preset formula, or may be obtained based on empirical values, which will not be limited in the present disclosure. In some embodiments, the predetermined threshold is 0.8 mm.

In exemplary embodiments, the front assembly sliding structure includes at least one first magnetic body 221 and at least one second magnetic body 230.

The number of the first magnetic body 221 may be equal or not equal to the number of the second magnetic body 230. If the number of the first magnetic body 221 is equal to the number of the second magnetic body 230, each first magnetic body 221 corresponds to one second magnetic body 230, and a combination of one first magnetic body 221 and one second magnetic body 230 may be referred as a magnetic body group. If the number of the first magnetic body 221 is not equal to the number of the second magnetic body 230, one first magnetic body 221 may correspond to at least two second magnetic bodies 230, and a combination of one first magnetic body 221 and at least two second magnetic bodies 230 may be referred as a magnetic body group. Alternatively, one second magnetic body 230 may correspond to at least two first magnetic bodies 221, and a combination of one second magnetic body 230 and at least two first magnetic bodies 221 may be referred as a magnetic body group.

The front assembly sliding structure may include at least one magnetic body group. When the front assembly sliding structure includes one magnetic body group, the magnetic body group may be located at a central position or a bottom of the front assembly sliding structure, which will not be limited herein. When the front assembly sliding structure includes at least two magnetic body groups, the at least two magnetic body groups may be evenly distributed in the front assembly sliding structure to improve a sliding stability of the front slider 220.

In some embodiments, the front assembly sliding structure further includes a non-magnetic shim disposed between the first magnetic body 221 and the second magnetic body 230 and configured to concentrate magnetic force lines. The function of the non-magnetic shim is to concentrate the dispersed magnetic force lines, and the more concentrated the magnetic force lines are, the greater the force generated is. Therefore, by setting the non-magnetic shim, the force in the first direction or the second direction is increased, so as to improve a sliding speed of the front slider 220.

Figure 6:
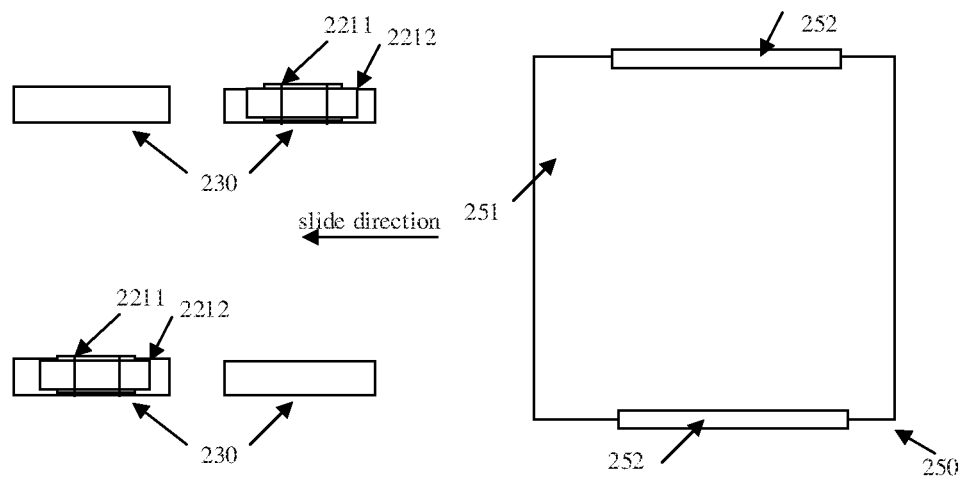
FIG. 6 is a top view of a slide rail assembly according to an embodiment of the present disclosure.

In some embodiments, shown in FIG. 6, the front assembly sliding structure further includes a slide rail assembly 250, and the slide rail assembly 250 includes a sliding plate 251 and a sliding rail 252. The sliding plate 251 is connected to the sliding rail 252 and is slidable relative to the sliding rail 252.

Referring to FIGS. 2, 4, and 5, the front slider 220 may be disposed in the sliding plate 251, and the sliding rail 252 is disposed on the panel 210. In this way, the front slider 220 is slidable from the first position to the second position or from the second position to the first position by sliding of the sliding plate 251 relative to the sliding rail 252.

If the front slider 220 is disposed in the sliding plate 251, reference can be made to FIG. 4 and FIG. 5, which illustrate positional relationships of the electromagnet, the first magnet and the second magnet when the slide rail assembly 250 is slid.

In an embodiment, besides driven by the current automatically generated by the terminal, the slide of the front slider 220 may also be manually controlled by a user, both of which will be introduced below.

In a first controlling mode, the front slider 220 is completely manually controlled by the user to slide to the first position or the second position. That is, the force during the whole sliding process of the front slider 220 is provided by the user, and the terminal does not generate the current. In this case, since the terminal does not generate the current, the electromagnet is not magnetized, and the force between the first magnetic body 221 and the second magnetic body 230 disappears. When a force in the first direction is applied to the front slider 220 by the user, the front slider 220 is slid from the first position to the second position; or when a force in the second direction is applied to the front slider 220 by the user, the front slider 220 is slid from the second position to the first position.

In a second controlling mode, the front slider 220 is manually controlled by the user to slide a certain distance first, and the terminal, when sensing the slide of the front slider 220, generates the current to magnetize the electromagnet, thereby generating forces between the electromagnet and the first magnet and between the electromagnet and the second magnet, which enables the front slider 220 to continue sliding until reaching the first position or the second position. In this mode, the initial force driving the front slider 220 to slide is provided by the user, and the subsequent force is provided by the terminal. That is, a small force is applied to the front slider 220 by the user first to give the front slider 220 a sliding tendency, and the front slider 220 is able to continue sliding under the force automatically generated by the terminal.

In exemplary embodiments, referring to FIG. 2, the front assembly sliding structure 200 further includes a Hall element 260. The Hall element 260 includes a Hall sensor 261 and a third magnet 262. The Hall sensor 261 is disposed in the front slider 220, and the third magnet 262 is disposed in the panel 210, or the Hall sensor 261 is disposed in the panel 210, and the third magnet 262 is disposed in the front slider 220, which will not be limited herein. As an example, shown in FIG. 2, the Hall sensor 261 is disposed in the front slider 220, and the third magnet 262 is disposed in the panel 210. The Hall sensor 261 is configured to determine a sliding direction of the front slider 220 relative to the panel 210 according to the third magnet 262, and trigger the current in the third direction when the sliding direction of the front slider 220 relative to the panel 210 is the first direction, or trigger the current in the fourth direction when the sliding direction of the front slider 220 relative to the panel 210 is the second direction.

When the user controls the front slider 220 to slide, magnetic induction lines of the third magnet 262 are cut, and the Hall sensor 261 is able to sense the slide of the front slider 220. At this time, the Hall sensor 261 reports a first triggering signal to the terminal. When the terminal determines according to the first triggering signal that the sliding direction of the front slider 220 is the first direction, the terminal generates the current in the third direction, and outputs the current in the third direction to the electromagnet, such that the force in the first direction is generated between the first magnetic body 221 and the second magnetic body 230, thereby enabling the front slider 220 to continue sliding in the first direction, until reaching the second position. When the terminal determines according to the first triggering signal that the sliding direction of the front slider 220 is the second direction, the terminal generates a current in the fourth direction, and outputs the current in the fourth direction to the electromagnet, such that the force in the second direction is generated between the first magnetic body 221 and the second magnetic body 230, thereby enabling the front slider 220 to continue sliding in the second direction, until reaching the first position.

It should be noted that, as compared with driven by a mechanical structure, such as a spring and the like, the slide of the front slider 220 driven by the electromagnet and the permanent magnet according to embodiments of the present disclosure achieves several advantages in implementation as follows.

1. The spring is of a larger volume, and a thickness of the spring body is at least 0.6 mm, so that the slide rail assembly is thicker and is of a thickness of at least 1.8 mm. However, in embodiments of the present disclosure, as the electromagnet and the permanent magnet are thinner, a thickness of the slide rail assembly 250 is about 1.2 mm, which enables to achieve a thinner slide rail assembly 250.

2. In order to realize the mechanical structure of the spring, a rear panel is usually perforated to place the spring, which weakens the strength of the rear panel, resulting in a poor impact resistance, and also reduces the reliability of a terminal having an ultra-thin body. However, in embodiments of the present disclosure, the rear panel does not need to be perforated, thereby improving the reliability of the terminal.

3. The spring is of a poor fatigue resistance, and a spring force of the spring will change with the time of use in the life cycle, which will affect the hand feeling of the user. However, in embodiments of the present disclosure, the magnetism will not change with the time, thereby guaranteeing the hand feeling of the user.

4. Uneven spring force will result in a gap in the appearance of the terminal. However, in embodiments of the present disclosure, as the attraction and repulsion generated by the magnetism are uneven, there is no gap in the appearance of the terminal.

5. The slide of the front slider controlled by the spring needs to be triggered, and thus cannot achieve automatic slide. However, in embodiments of the present disclosure, the automatic slide of the front slider 250 is able to be achieved by controlling on and off of the current.

In embodiments of the present disclosure, by disposing the front element on the front slider, the front assembly sliding structure is able to control the front element to be located at the second position where the front element is not shielded by a front panel when the front element needs to be used, so as to ensure the normal use of the front element; and control the front element to be located at the first position where the front element is shielded by the front panel when the front element does not need to be used, without fixing the front element in the front panel of the terminal, thereby increasing a screen ratio of a display screen in the front panel.

The dispersed magnetic force lines are concentrated by the non-magnetic shim disposed between the first magnetic body and the second magnetic body, and the more concentrated the magnetic force lines are, the greater the force generated is. Therefore, by setting the non-magnetic shim, the force in the first direction or the second direction is increased, thereby improving the sliding speed of the front slider.

By disposing at least two magnetic body groups in the front assembly sliding structure, and evenly distributing the at least two magnetic body groups in the front assembly sliding structure, the sliding stability of the front slider is improved.

With the Hall sensor, the sliding direction of the front slider relative to the panel is determined according to the third magnet, and the current in the third direction is triggered when the sliding direction of the front slider relative to the panel is the first direction, or the current in the fourth direction is triggered when the sliding direction of the front slider relative to the panel is the second direction. Under the action of the current, the electromagnet is magnetized, so that the force is generated between the first magnetic body and the second magnetic body to enable the front slider to continue sliding, until reaching the first position or the second position. Accordingly, when a small force is applied to the front slider by the user first to give the front slider a sliding tendency, the front slider is able to continue sliding under the force automatically generated by the terminal, thereby reducing the user effort.

Figure 7:
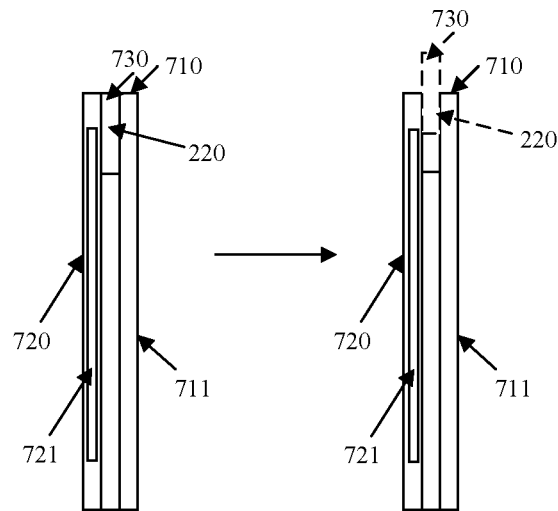
FIG. 7 is a schematic diagram of a terminal according to an embodiment of the present disclosure.
Figure 8:
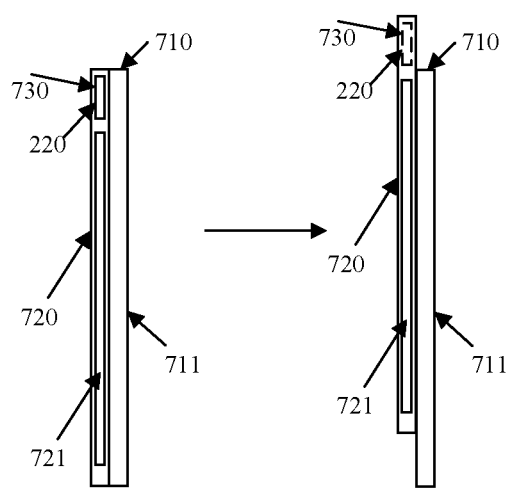
FIG. 8 is a schematic diagram of a terminal according to an embodiment of the present disclosure.

FIG. 7 and FIG. 8 are schematic diagrams of a terminal 700 according to exemplary embodiments of the present disclosure. The terminal 700 includes a front panel 710 provided with a display screen 711, a rear panel 720 provided with a mainboard 721, and a front assembly sliding structure 730. The front assembly sliding structure 730 is connected to the front panel 710 and the rear panel 720, respectively. In the embodiments, the first position is a position where a front element in the front slider 220 is shielded by the front panel 710, and the second position is a position where the front element in the front slider 220 is not shielded by the front panel 710.

In one embodiment, shown in FIG. 7, the front panel 710 and the rear panel 720 define a U-shaped groove in which the front slider 220 is disposed. The front slider 220 is connected to the mainboard 721, and the second magnetic body 230 (not shown in FIG. 7) is disposed on the front panel 710 slidable relative to the front slider 220. In the illustrated embodiment in FIG. 7, a position of the front slider 220 represented by a solid line is the first position, the position of the front slider 220 represented by a dotted line is the second position, and the front slider 220 is slidable up and down.

In one embodiment, shown in FIG. 8, the front panel 710 and the rear panel 720 define an accommodating chamber, the front slider 220 is disposed on the mainboard 721, and the second magnetic body 230 (not shown in FIG. 8) is disposed on the front panel 710 slidable relative to the front slider 220. In the illustrated embodiment in FIG. 8, a position of the front slider 220 represented by a solid line is the first position, the position of the front slider 220 represented by a dotted line is the second position, and the front slider 220 is slidable up and down.

Structures of the terminal 700 in the above embodiments will be described below.

1. The first magnetic body in the terminal 700 is an electromagnet, and the second magnetic body in the terminal 700 includes a first magnet and a second magnet disposed side by side in a predetermined direction. Alternatively, the first magnetic body includes a first magnet and a second magnet disposed side by side in a predetermined direction, and the second magnetic body is an electromagnet. The electromagnet is connected to the mainboard 721, and the predetermined direction is the first direction or the second direction. A magnetism of a pole of the first magnet facing the electromagnet is opposite to that of a pole of the second magnet facing the electromagnet. When the electromagnet is magnetized by a current in a third direction generated by the mainboard 721, an attraction in the first direction is present between the electromagnet and the first magnet, and a repulsion in the first direction is present between the electromagnet and the second magnet. When the electromagnet is magnetized by a current in a fourth direction generated by the mainboard 721, a repulsion in the second direction is present between the electromagnet and the first magnet, and an attraction in the second direction is present between the electromagnet and the second magnet, where the fourth direction is opposite to the third direction.

Details regarding the electromagnet, the first magnet, the second magnet and interactions among the electromagnet, the first magnet and the second magnet are described in embodiments with reference to FIG. 2, and will not be repeated herein.

In an embodiment, the electromagnet is connected to the mainboard 721, and the mainboard 721 generates the current in the third direction and output the current in the third direction to the electromagnet; or the mainboard 721 generates the current in the fourth direction and output the current in the fourth direction to the electromagnet.

2. The slide rail assembly of the terminal 700 includes a sliding plate disposed on the mainboard 721 or connected to the mainboard 721, and a sliding rail disposed on the front panel 710. The sliding rail is connected to the sliding plate, and the front slider is disposed on the sliding plate. The front slider is configured to slide from the first position to the second position or from the second position to the first position by sliding of the sliding plate relative to the sliding rail.

The sliding plate, the sliding rail, and interactions between the sliding plate and the sliding rail are described in detail in embodiments with reference to FIG. 2, and will not be repeated herein.

When the front slider 220 is disposed on the sliding plate, the sliding plate may be disposed on the mainboard 721 or connected to the mainboard 721, so as to achieve the arrangement of the front slider 220 on the mainboard 721.

3. The terminal 700 may further include a Hall element, and the Hall element includes a Hall sensor and a third magnet. The Hall sensor is disposed in the front slider 220, and the third magnet is disposed in the front panel 710, or the Hall sensor is disposed in the front panel 710, and the third magnet is disposed in the front slider 220. The Hall sensor is configured to generate a first triggering signal and report the first triggering signal to the mainboard 721 when it is determined according to the third magnet that the front slider 220 is slid relative to the front panel 710. The mainboard 721 is configured to generate the current in the third direction according to the first triggering signal, and output the current in the third direction to the electromagnet when the sliding direction of the front slider 220 relative to the front panel 710 is the first direction; or configured to generate the current in the fourth direction according to the first triggering signal, and output the current in the fourth direction to the electromagnet when the sliding direction of the front slider 220 relative to the front panel 710 is the second direction.

The Hall sensor, the third magnet, and interactions between the Hall sensor and the third magnet are described in detail in embodiments with reference to FIG. 2, and will not be repeated herein.

When the Hall sensor is disposed in the front slider 220, as the front slider 220 is disposed on or connected to the mainboard 721, the Hall sensor is connected to the mainboard 721. When the Hall sensor is disposed in the front panel 710, the Hall sensor is connected to the mainboard 721.

After the Hall sensor is connected to the mainboard 721, the Hall sensor may report the first triggering signal to the mainboard 721, and the mainboard 721 generates the current in the third direction or the current in the fourth direction according to the first triggering signal.

4. The terminal 700 further includes a Hall element, and the Hall element includes a Hall sensor and a third magnet. The Hall sensor is disposed in the front slider 220, and the third magnet is disposed in a front panel 710; or the Hall sensor is disposed in the front panel 710, and the third magnet is disposed in the front slider 220. The Hall sensor is configured to generate a second triggering signal and report the second triggering signal to the mainboard 721 when it is determined according to the third magnet that the front slider 220 is slid relative to the front panel 710 under an action of an user. When a first application is run by the mainboard 721, the mainboard 721 is configured to determine according to the first application and the second triggering signal to call a second application of the front element, and display the first application in a first region and the second application in a second region, where the first region and the second region are obtained by dividing the display screen.

In some embodiments, other controlling functions may be developed for the Hall element. Taking a dual screen control as an example, the Hall sensor may be configured to generate the second triggering signal and report the second triggering signal to the mainboard 721 when the Hall sensor senses the slide of the front slider 220. When the first application is running and a launching request of the second application is received by the mainboard 721, the mainboard 721 is configured to launch the second application according to the launching request, permit the second application to call a front element according to the second triggering signal, and display the first application in the first region and the second application in the second region, where the first region and the second region are obtained by dividing the display screen 711.

The first application may be an application that does not need to call the front element, and the second application may be an application that needs to call the front element, such as a video telephony application which needs to call the front camera or the receiver, which will not be limited herein. After the mainboard 721 launches the second application according to the launching request, as the second triggering signal is a signal generated when the user slides the front slider 220 from the first position to the second position, and the first application does not need to call the front element, it can be seen that the user allows the second application to call the front element. In such case, the mainboard 721 permits the second application to call the front element. As the mainboard 721 runs the first application at this time, in order not to disturb the running of the first application, the mainboard 721 may divide the display screen 711 into two display regions, i.e., the first region and the second region, and display the first application in the first region and display the second application in the second region, so as to achieve the effect of dual screen display.

The process of generating the second triggering signal by the Hall sensor is similar to that of generating the first triggering signal.

For example, if the first application is a reading application, and the second application is a video telephony application, the terminal displays a page of a book in the first region of the display screen, and displays photographic pictures of the other party in the second area of the display screen during the video telephony.

In embodiments of the present disclosure, by disposing the front element on the front slider, the terminal is able to control the front element to be located at the second position where the front element is not shielded by the front panel when the front element needs to be used, so as to ensure the normal use of the front element; and control the front element to be located at the first position where the front element is shielded by the front panel when the front element does not need to be used, without fixing the front element in the front panel of the terminal, thereby increasing a screen ratio of a display screen in the front panel.

Figure 9:
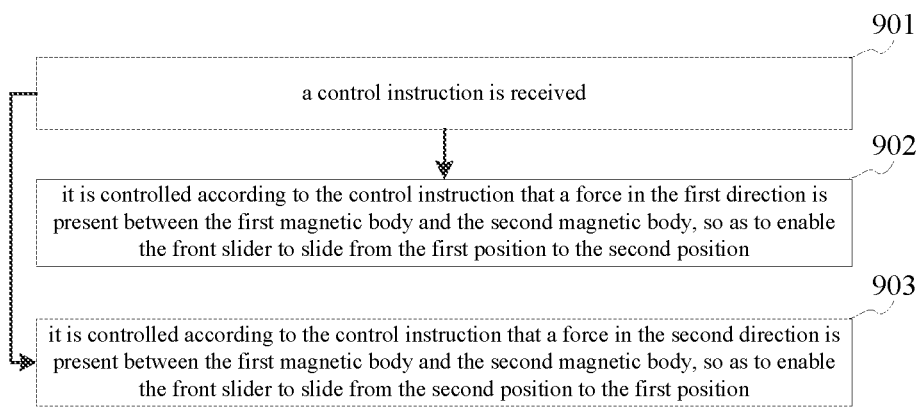
FIG. 9 is a flow chart of a controlling method of a front assembly sliding structure according to an embodiment of the present disclosure.

FIG. 9 is a flow chart of a controlling method 900 of a front assembly sliding structure according to an embodiment of the present disclosure. For example, the controlling method 900 may be applied to the terminal 700 illustrated in FIG. 7 and FIG. 8. Referring to FIG. 9, the controlling method 900 includes the following operations illustrated at blocks of FIG. 9.

At block 901, a control instruction is received.

At block 902, it is controlled according to the control instruction that a force in the first direction is present between the first magnetic body and the second magnetic body, so as to enable the front slider to slide from the first position to the second position.

The first position is a position where the front element in the front slider is shielded by the front panel, and the second position is a position where the front element in the front slider is not shielded by the front panel.

At block 903, it is controlled according to the control instruction that a force in the second direction is present between the first magnetic body and the second magnetic body, so as to enable the front slider to slide from the second position to the first position.

The first direction is opposite to the second direction.

In embodiments of the present disclosure, by disposing the front element on the front slider, the controlling method of the front assembly sliding structure is able to control, according to the control instruction, the front element to be located at the second position where the front element is not shielded by the front panel when the front element needs to be used, so as to ensure the normal use of the front element; and control, according to the control instruction, the front element to be located at the first position where the front element is shielded by the front panel when the front element does not need to be used, without fixing the front element in the front panel of the terminal, thereby increasing a screen ratio of a display screen in the front panel.

Figure 10:
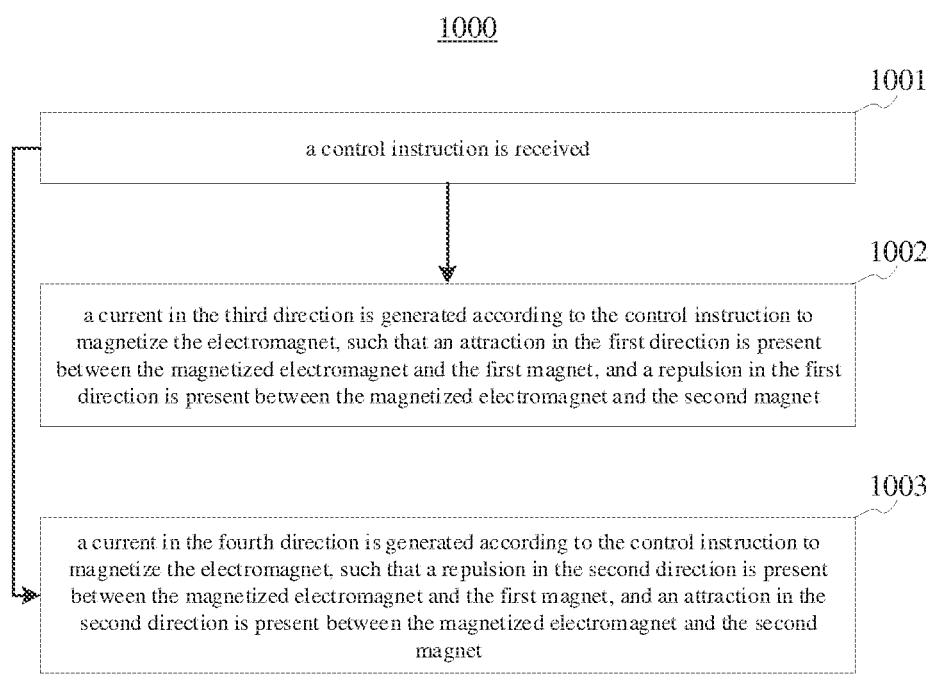
FIG. 10 is a flow chart of a controlling method of a front assembly sliding structure according to an embodiment of the present disclosure.

FIG. 10 is a flow chart of a controlling method 1000 of a front assembly sliding structure according to an embodiment of the present disclosure. For example, the controlling method 100 may be applied to the terminal 700 illustrated in FIG. 7 and FIG. 8. Referring to FIG. 10, the controlling method 1000 includes the following operations illustrated at blocks of FIG. 10.

At block 1001, a control instruction is received.

The control instruction may be generated by the terminal as needed according to scenarios. For example, when the user picks up an incoming call, the terminal determines that the user needs to use the receiver in the front slider, and generates the control instruction to control the front slider to slide to expose the receiver for the user to use. For another example, when the user wants to take a selfie, the terminal determines that the user needs to use the front camera in the front slider, and generates the control instruction to control the front slider to slide to expose the front camera for the user to use. The control instruction may also be an instruction received by the terminal, such as a voice instruction, a gesture instruction or a text instruction, and the present disclosure will not limit an acquiring mode of the control instruction.

At block 1002, when the first magnetic body is an electromagnet, and the second magnetic body includes a first magnet and a second magnet; or the first magnetic body includes a first magnet and a second magnet, and the second magnetic body is an electromagnet, a current in the third direction is generated according to the control instruction to magnetize the electromagnet. Accordingly, an attraction in the first direction is present between the magnetized electromagnet and the first magnet, and a repulsion in the first direction is present between the magnetized electromagnet and the second magnet, so as to enable the front slider to slide from the first position to the second position.

The electromagnet is a component that generates a magnetic field when energized, and may include a soft magnetic body and a coil wound outside the soft magnetic body. When the coil is energized, the soft magnetic body is magnetized, and has magnetism thereby. Poles of the electromagnet are related to a direction of a current in the coil. Assuming that a pole at an end of the electromagnet is an N pole when the coil is energized by a forward current, if the coil is energized by a reverse current, the pole at the same end of the electromagnet will be an S pole.

The first direction is a sliding direction of the front slider from an inside of the terminal to an outside of the terminal. If a three-dimensional coordinate is established with a center of the terminal as an origin, an x-axis parallel to a bottom edge of the terminal, a y-axis parallel to a side edge of the terminal and a z-axis perpendicular to a plane where the terminal is located, if the front slider is extensible or retractable from a top of the terminal, the first direction is a direction of the y-axis; if the front slider is extensible or retractable from the side edge of the terminal, the first direction is a direction of the x-axis.

The first position is a position where the front element in the front slider is shielded by the front panel, and the second position is a position where the front element in the front slider is not shielded by the front panel.

At block 1003, a current in the fourth direction is generated according to the control instruction to magnetize the electromagnet. Accordingly, a repulsion in the second direction is present between the magnetized electromagnet and the first magnet, and an attraction in the second direction is present between the magnetized electromagnet and the second magnet, so as to enable the front slider to slide from the second position to the first position.

The fourth direction is opposite to the third direction. That is, when the third direction is a forward direction, the fourth direction is a reverse direction; when the third direction is a reverse direction, the fourth direction is a forward direction.

The second direction is a sliding direction of the front slider from the outside of the terminal to the inside of the terminal, and the first direction is opposite to the second direction. Also taking the above three-dimensional coordinate as an example, if the front slider is extensible or retractable from the top of the terminal, the second direction is the direction of the y-axis; if the front slider is extensible or retractable from the side edge of the terminal, the second direction is the direction of the x-axis.

In an embodiment, besides driven by the current automatically generated by the terminal as described above, the slide of the front slider may also be manually controlled by the user first, and promoted by the current generated by the terminal when the terminal senses the slide of the front slider. In this case, when the front assembly sliding structure further includes a Hall element, the method further includes: receiving a first triggering signal reported by a Hall sensor, in which the first triggering signal is generated by the Hall sensor when it is determined according to the third magnet that the front slider is slid relative to the front panel under an action of the user; generating a current in a third direction, and outputting the current in the third direction to the electromagnet when it is determined according to the first triggering signal that a sliding direction of the front slider relative to the front panel is the first direction; or generating a current in a fourth direction and outputting the current in the fourth direction to the electromagnet when it is determined according to the first triggering signal that the sliding direction of the front slider relative to the front panel is the second direction.

The Hall element includes the Hall sensor and a third magnet. When the user controls the front slider to slide, magnetic induction lines of the third magnet are cut, the Hall sensor is able to sense the slide of the front slider, and reports the first triggering signal to the terminal. When the terminal determines according to the first triggering signal that the sliding direction of the front slider is the first direction, the terminal generates the current in the third direction, and outputs the current in the third direction to the electromagnet, such that a force in the first direction is generated between the first magnetic body and the second magnetic body to enable the front slider to continue sliding in the first direction, until reaching the second position. When the terminal determines according to the first triggering signal that the sliding direction of the front slider is the second direction, the terminal generates a current in the fourth direction, and outputs the current in the fourth direction to the electromagnet, such that a force in the second direction is generated between the first magnetic body and the second magnetic body to enable the front slider to continue sliding in the second direction, until reaching the first position.

In some embodiments, other controlling functions may be developed for the Hall element. Taking a dual screen control as an example, the method further includes: receiving a second triggering signal reported by the Hall sensor, in which the second triggering signal is generated by the Hall sensor when it is determined according to the third magnet that the front slider is slid relative to the front panel under the action of the user; launching a second application according to a launching request when a first application is run and the launching request of the second application is received, permitting the second application to call the front element according to the second triggering signal, and displaying the first application in a first region and the second application in a second region, where the first region and the second region are obtained by dividing a display screen.

The first application may be an application that does not need to call the front element, and the second application may be an application that needs to call the front element, such as a video telephony application which needs to call the front camera and the receiver, which will not be limited herein. After the terminal launches the second application according to the launching request, as the second triggering signal is a signal generated when the user slides the front slider from the first position to the second position, and the first application does not need to call the front element, it can be seen that the user allows the second application to call the front element. In such case, the terminal permits the second application to call the front element. As the terminal runs the first application at this time, in order not to disturb the running of the first application, the terminal may divide the display screen into two display regions, i.e., the first region and the second region, and display the first application in the first region and display the second application in the second region, so as to achieve the effect of dual screen display.

The process of generating the second triggering signal by the Hall sensor is similar to that of generating the first triggering signal.

For example, if the first application is a reading application, and the second application is a video telephony application, the terminal displays a page of a book in the first region of the display screen, and displays photographic pictures of the other party in the second area of the display screen during the video telephony.

In embodiments of the present disclosure, by disposing the front element on the front slider, the controlling method is able to control, according to the control instruction, the front element to be located at the second position where the front element is not shielded by the front panel when the front element needs to be used, so as to ensure the normal use of the front element; and control, according to the control instruction, the front element to be located at the first position where the front element is shielded by the front panel when the front element does not need to be used, without fixing the front element in the front panel of the terminal, thereby increasing a screen ratio of the display screen in the front panel.

With the Hall sensor, the sliding direction of the front slider relative to the panel is determined according to the third magnet, and the current in the third direction is triggered when the sliding direction of the front slider relative to the panel is the first direction, or the current in the fourth direction is triggered when the sliding direction of the front slider relative to the panel is the second direction. Under the action of the current, the electromagnet is magnetized, so that the force is generated between the first magnetic body and the second magnetic body to enable the front slider to continue sliding, until reaching the first position or the second position. Therefore, when a small force is applied to the front slider by the user first to give the front slider a sliding tendency, the front slider is able to continue sliding under the force automatically generated by the terminal, thereby reducing the user effort.

Figure 11:
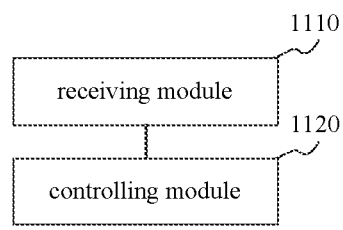
FIG. 11 is a block diagram of a controlling apparatus of a front assembly sliding structure according to an embodiment of the present disclosure.

FIG. 11 is a block diagram of a controlling apparatus 1100 of a front assembly sliding structure according to an embodiment of the present disclosure. For example, the controlling apparatus 1100 may be applied to the terminal as illustrated in FIG. 7 or FIG. 8. Referring to FIG. 11, the controlling apparatus 1100 includes a receiving module 1110 and a controlling module 1120.

The receiving module 1110 is configured to receive a control instruction.

The controlling module 1120 is configured to control that a force in the first direction is present between the first magnetic body and the second magnetic body according to the control instruction received by the receiving module 1110, so as to enable the front slider to slide from a first position to a second position.

The controlling module 1120 is also configured to control that a force in the second direction is present between the first magnetic body and the second magnetic body according to the control instruction received by the receiving module 1110, so as to enable the front slider to slide from the second position to the first position.

The first direction is opposite to the second direction; the first position is a position where the front element in the front slider is shielded by the front panel; and the second position is a position where the front element in the front slider is not shielded by the front panel.

In embodiments of the present disclosure, by disposing the front element on the front slider, the controlling apparatus of the front assembly sliding structure is able to control, according to the control instruction, the front element to be located at the second position where the front element is not shielded by the front panel when the front element needs to be used, so as to ensure the normal use of the front element; and control, according to the control instruction, the front element to be located at the first position where the front element is shielded by the front panel when the front element does not need to be used, without fixing the front element in the front panel of the terminal, thereby increasing a screen ratio of the display screen in the front panel.

Figure 12:
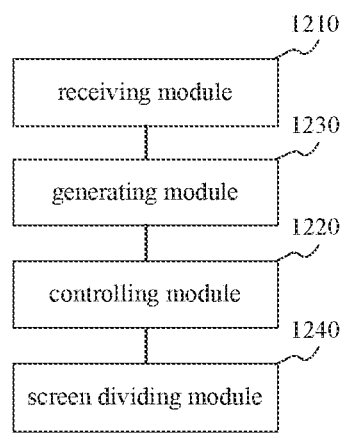
FIG. 12 is a block diagram of a controlling apparatus of a front assembly sliding structure according to an embodiment of the present disclosure.

FIG. 12 is a block diagram of a controlling apparatus 1200 of a front assembly sliding structure according to an embodiment of the present disclosure. For example, the controlling apparatus 1200 may be applied to the terminal as illustrated in FIG. 7 or FIG. 8. Referring to FIG. 12, the controlling apparatus 1200 includes a receiving module 1210 and a controlling module 1220.

The receiving module 1210 is configured to receive a control instruction.

The controlling module 1220 is configured to control that a force in the first direction is present between the first magnetic body and the second magnetic body according to the control instruction received by the receiving module 1210, so as to enable the front slider to slide from the first position to the second position.

The controlling module 1220 is also configured to control that a force in the second direction is present between the first magnetic body and the second magnetic body according to the control instruction received by the receiving module 1210, so as to enable the front slider to slide from the second position to the first position.

The first direction is opposite to the second direction; the first position is a position where the front element in the front slider is shielded by the front panel; and the second position is a position where the front element in the front slider is not shielded by the front panel.

In some embodiments, when the first magnetic body is an electromagnet, and the second magnetic body includes a first magnet and a second magnet; or the first magnetic body includes a first magnet and a second magnet, and the second magnetic body is an electromagnet, the controlling module 1220 is further configured to generate a current in the third direction according to the control instruction to magnetize the electromagnet, such that an attraction in the first direction is present between the magnetized electromagnet and the first magnet, and a repulsion in the first direction is present between the magnetized electromagnet and the second magnet.

In some embodiments, the controlling module 1220 is further configured to generate a current in the fourth direction according to the control instruction to magnetize the electromagnet, such that a repulsion in the second direction is present between the magnetized electromagnet and the first magnet, and an attraction in the second direction is present between the magnetized electromagnet and the second magnet, where the fourth direction is opposite to the third direction.

In some embodiments, when the front assembly sliding structure further includes a Hall element, the receiving module 1210 is further configured to receive a first triggering signal reported by a Hall sensor, in which the first triggering signal is generated by the Hall sensor when it is determined according to a third magnet that the front slider is slid relative to the front panel under an action of the user; the apparatus further includes: a generating module 1230 configured to generate the current in the third direction, and output the current in the third direction to the electromagnet when it is determined according to the first triggering signal that a sliding direction of the front slider relative to the front panel is the first direction; or generate the current in the fourth direction and output the current in the fourth direction to the electromagnet when it is determined according to the first triggering signal that the sliding direction of the front slider relative to the front panel is the second direction.

In some embodiments, when the front assembly sliding structure further includes a Hall element, the receiving module 1210 is further configured to receive a second triggering signal reported by the Hall sensor, in which the second triggering signal is generated by the Hall sensor when it is determined according to the third magnet that the front slider is slid relative to the front panel under the action of the user; the apparatus further includes: a screen dividing module 1240 configured to: launch a second application according to a launching request when a first application is running and the launching request of the second application is received, permit the second application to call the front element according to the second triggering signal, divide the display screen into a first region and a second region, and display the first application in the first region and the second application in the second region.

In embodiments of the present disclosure, by disposing the front element on the front slider, the controlling apparatus of the front assembly sliding structure is able to control, according to the control instruction, the front element to be located at the second position where the front element is not shielded by the front panel when the front element needs to be used, so as to ensure the normal use of the front element; and control, according to the control instruction, the front element to be located at the first position where the front element is shielded by the front panel when the front element does not need to be used, without fixing the front element in the front panel of the terminal, thereby increasing a screen ratio of the display screen in the front panel.

With the Hall sensor, the sliding direction of the front slider relative to the panel is determined according to the third magnet, and the current in the third direction is triggered when the sliding direction of the front slider relative to the panel is the first direction, or the current in the fourth direction is triggered when the sliding direction of the front slider relative to the panel is the second direction; and under the action of the current, the electromagnet is magnetized, so that the force is generated between the first magnetic body and the second magnetic body to enable the front slider to continue sliding, until reaching the first position or the second position. Therefore, when a small force is applied to the front slider by the user first to give the front slider a sliding tendency, the front slider is able to continue sliding under the force automatically generated by the terminal, thereby reducing the user effort.

With respect to the apparatus in the above embodiments, the specific manners for performing operations for individual modules therein have been described in detail in the embodiments regarding the methods, which will not be repeated herein.

Embodiments of the present disclosure provide a controlling device of a front assembly sliding structure, which is able to achieve the controlling method of the front assembly sliding structure according to the present disclosure. The controlling device of the front assembly sliding structure includes: a processor; and a memory for storing instructions executable by the processor, in which the processor is configured to: receive a control instruction; control that a force in the first direction is present between the first magnetic body and the second magnetic body according to the control instruction, so as to enable the front slider to slide from the first position to the second position; control that a force in the second direction is present between the first magnetic body and the second magnetic body according to the control instruction, so as to enable the front slider to slide from the second position to the first position. The first direction is opposite to the second direction; the first position is a position where the front element in the front slider is shielded by the front panel; and the second position is a position where the front element in the front slider is not shielded by the front panel.

Figure 13:
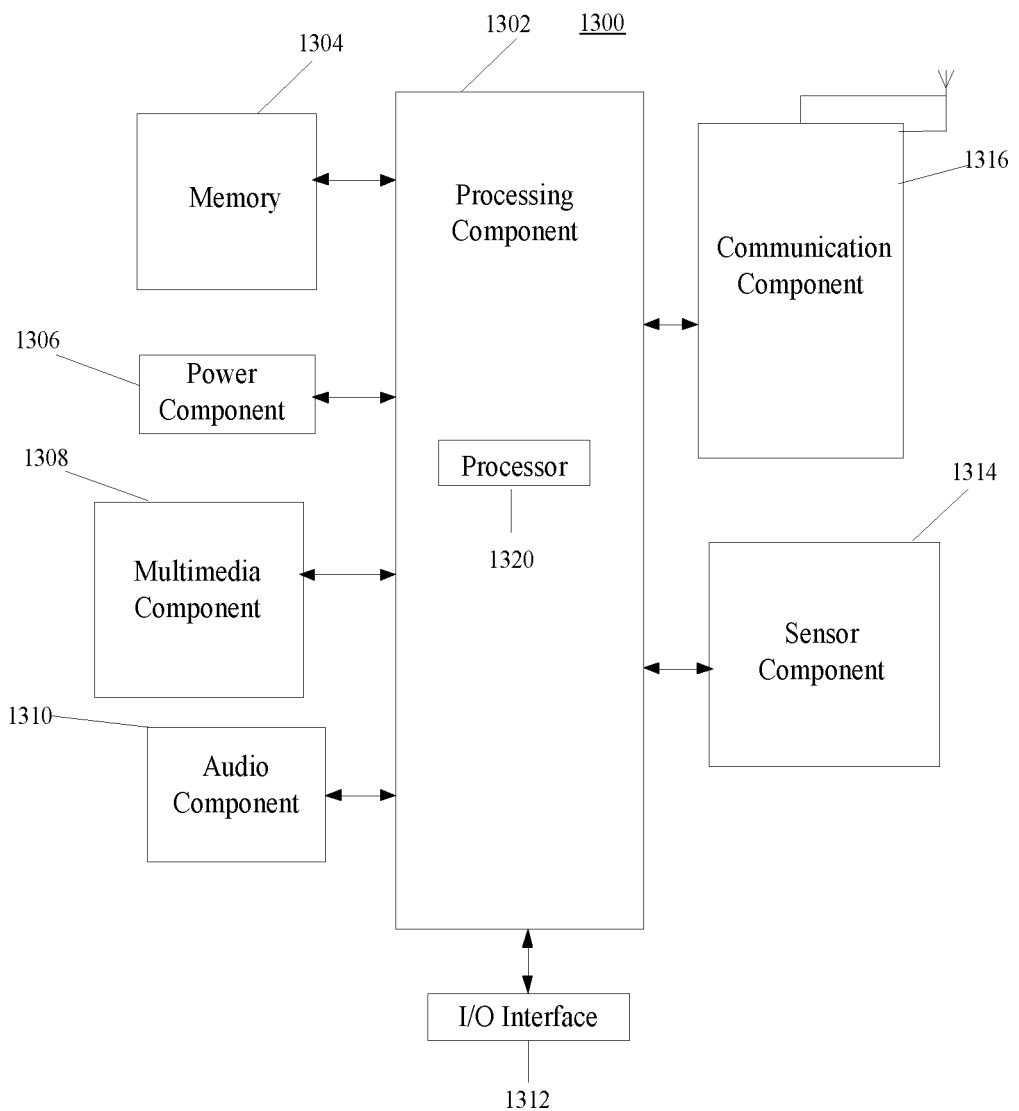
FIG. 13 is a block diagram of a device using a front assembly sliding structure according to an embodiment of the present disclosure.

FIG. 13 is a block diagram of a device 1300 using a front assembly sliding structure according to an embodiment of the present disclosure. For example, the device 1300 may be a mobile phone, a computer, a digital broadcast terminal, a messaging device, a gaming console, a tablet, a medical device, exercise equipment, a personal digital assistant, and the like.

Referring to FIG. 13, the device 1300 may include one or more of the following components: a processing component 1302, a memory 1304, a power component 1306, a multimedia component 1308, an audio component 1310, an input/output (I/O) interface 1312, a sensor component 1314, and a communication component 1316.

The processing component 1302 typically controls overall operations of the device 1300, such as the operations associated with display, telephone calls, data communications, camera operations, and recording operations. The processing component 1302 may include one or more processors 1320 to execute instructions to perform all or part of the steps in the above described methods. Moreover, the processing component 1302 may include one or more modules which facilitate the interaction between the processing component 1302 and other components. For instance, the processing component 1302 may include a multimedia module to facilitate the interaction between the multimedia component 1308 and the processing component 1302.

The memory 1304 is configured to store various types of data to support the operation of the device 1300. Examples of such data include instructions for any applications or methods operated on the device 1300, contact data, phonebook data, messages, pictures, video, etc. The memory 1304 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1306 provides power to various components of the device 1300. The power component 1306 may include a power management system, one or more power sources, and any other components associated with the generation, management, and distribution of power in the device 1300.

The multimedia component 1308 includes a screen providing an output interface between the device 1300 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 1308 includes a front camera and/or a rear camera. The front camera and/or the rear camera may be located in the front slider as the front elements, and may receive an external multimedia datum while the device 1300 is in an operation mode, such as a photographing mode or a video mode. Each of the front camera and the rear camera may be a fixed optical lens system or have focus and optical zoom capability.

The audio component 1310 is configured to output and/or input audio signals. For example, the audio component 1310 includes a microphone ("MIC") configured to receive an external audio signal when the device 1300 is in an operation mode, such as a call mode, a recording mode, and a voice recognition mode. The received audio signal may be further stored in the memory 1304 or transmitted via the communication component 1316. In some embodiments, the audio component 1310 further includes a speaker to output audio signals.

The I/O interface 1312 provides an interface between the processing component 1302 and peripheral interface modules, such as a keyboard, a click wheel, buttons, and the like. The buttons may include, but are not limited to, a home button, a volume button, a starting button, and a locking button.

The sensor component 1314 includes one or more sensors to provide status assessments of various aspects of the device 1300. For instance, the sensor component 1314 may detect an open/closed status of the device 1300, relative positioning of components, e.g., the display and the keypad, of the device 1300, a change in position of the device 1300 or a component of the device 1300, a presence or absence of user contact with the device 1300, an orientation or an acceleration/deceleration of the device 1300, and a change in temperature of the device 1300. The sensor component 1314 may include a proximity sensor configured to detect the presence of nearby objects without any physical contact. The sensor component 1314 may also include a light sensor, such as a CMOS or CCD image sensor, for use in imaging applications. In some embodiments, the proximity sensor and the light sensor may be located in the front slider as the front elements. In some embodiments, the sensor component 1314 may also include an accelerometer sensor, a gyroscope sensor, a magnetic sensor, a pressure sensor, or a temperature sensor.

The communication component 1316 is configured to facilitate communication, wired or wirelessly, between the device 1300 and other devices. The device 1300 can access a wireless network based on a communication standard, such as WiFi, 2G, or 3G, or a combination thereof. In one embodiment, the communication component 1316 receives a broadcast signal or broadcast associated information from an external broadcast management system via a broadcast channel In one embodiment, the communication component 1316 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In some embodiments, the device 1300 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In some embodiments, there is also provided a non-transitory computer-readable storage medium including instructions, such as included in the memory 1304, executable by the processor 1320 in the device 1300, for performing the above-described methods. For example, the non-transitory computer-readable storage medium may be a ROM, a RAM, a CD-ROM, a magnetic tape, a floppy disc, an optical data storage device, and the like.

In some embodiments, there is also provided a non-transitory computer-readable storage medium having stored therein instructions that, when executed by a processor of a mobile terminal, causes the mobile terminal to perform the controlling method of the front assembly sliding structure as described above.

In some embodiments, there is provided a computer-readable storage medium having stored therein at least one instruction, at least one program, a code set or an instruction set, in which the at least one instruction, the at least one program, the code set or the instruction set are loaded and executed by a processor to implement the controlling method of the front assembly sliding structure as described above.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A front assembly sliding structure, comprising:
   a front slider provided with a first magnetic body; and
   a second magnetic body disposed on a panel;
   wherein the front slider is slidable relative to the panel, and the first magnetic body is opposite to the second magnetic body when the front slider is in a first position; and
   the front slider is configured to slide from the first position to a second position when a force in a first direction is present between the first magnetic body and the second magnetic body, and configured to slide from the second position to the first position when a force in a second direction is present between the first magnetic body and the second magnetic body, the first direction being opposite to the second direction.

2. The front assembly sliding structure according to claim 1, wherein the first magnetic body is an electromagnet, and the second magnetic body comprises a first magnet and a second magnet disposed side by side in a predetermined direction; or the first magnetic body comprises a first magnet and a second magnet disposed side by side in a predetermined direction, and the second magnetic body is an electromagnet; the predetermined direction is the first direction or the second direction;
   a magnetism of a pole of the first magnet facing the electromagnet is opposite to that of a pole of the second magnet facing the electromagnet;
   when the electromagnet is magnetized by a current in a third direction, an attraction in the first direction is present between the electromagnet and the first magnet, and a repulsion in the first direction is present between the electromagnet and the second magnet; and
   when the electromagnet is magnetized by a current in a fourth direction, a repulsion in the second direction is present between the electromagnet and the first magnet, and an attraction in the second direction is present between the electromagnet and the second magnet;
   wherein the third direction is opposite to the fourth direction.

3. The front assembly sliding structure according to claim 2, wherein
   when the front slider is in the first position, the electromagnet is attached to the second magnet, and a central position of the electromagnet is at a first predetermined distance from a central position of the second magnet; and
   when the front slider is in the second position, the electromagnet is attached to the first magnet, and the central position of the electromagnet is at a second predetermined distance from a central position of the first magnet;
   wherein a distance between a central position of the first magnet and a central position of the second magnet is less than a predetermined threshold.

4. The front assembly sliding structure according to claim 2, comprising at least one first magnetic body and at least one second magnetic body.

5. The front assembly sliding structure according to claim 1, further comprising a non-magnetic shim disposed between the first magnetic body and the second magnetic body and configured to concentrate magnetic force lines.

6. The front assembly sliding structure according to claim 1, further comprising a slide rail assembly comprising:
a sliding rail disposed on the panel, and
a sliding plate which is connected to the sliding rail and on which the front slider is disposed;
wherein the front slider is configured to slide from the first position to the second position or from the second position to the first position by sliding of the sliding plate relative to the sliding rail.

7. The front assembly sliding structure according to claim 2, wherein the front slider is configured to slide from the first position to the second position when a force in the first direction is applied to the front slider; or configured to slide from the second position to the first position when a force in the second direction is applied to the front slider.

8. The front assembly sliding structure according to claim 7, further comprising a Hall element comprising a Hall sensor and a third magnet, wherein
the Hall sensor is disposed in the front slider, and the third magnet is disposed in the panel; or the Hall sensor is disposed in the panel, and the third magnet is disposed in the front slider;
the Hall sensor is configured to determine a sliding direction of the front slider relative to the panel according to the third magnet, and trigger the current in the third direction when the sliding direction of the front slider relative to the panel is the first direction, or trigger the current in the fourth direction when the sliding direction of the front slider relative to the panel is the second direction.

9. A terminal, comprising:
a front panel provided with a display screen;
a rear panel provided with a mainboard; and
a front assembly sliding structure, comprising:
a front slider provided with a first magnetic body; and
a second magnetic body disposed on the front panel;
wherein the front slider is slidable relative to the front panel, and the first magnetic body is opposite to the second magnetic body when the front slider is in a first position; and
the front slider is configured to slide from the first position to a second position when a force in a first direction is present between the first magnetic body and the second magnetic body, and configured to slide from the second position to the first position when a force in a second direction is present between the first magnetic body and the second magnetic body, the first direction being opposite to the second direction;
wherein the front assembly sliding structure is connected to the front panel and the rear panel, respectively; the first position is a position where a front element in the front slider is shielded by the front panel; and the second position is a position where the front element in the front slider is not shielded by the front panel.

10. The terminal according to claim 9, wherein the front panel and the rear panel provide a U-shaped groove in which the front slider is disposed; the front slider is connected to the mainboard, and the second magnetic body is disposed on the front panel slidable relative to the front slider.

11. The terminal according to claim 9, wherein the front panel and the rear panel provide an accommodating chamber, the front slider is disposed on the mainboard, and the second magnetic body is disposed on the front panel slidable relative to the front slider.

12. The terminal according to claim 9, wherein the first magnetic body is an electromagnet, and the second magnetic body comprises a first magnet and a second magnet disposed side by side in a predetermined direction; or the first magnetic body comprises a first magnet and a second magnet disposed side by side in a predetermined direction, and the second magnetic body is an electromagnet;
the electromagnet is connected to the mainboard, and the predetermined direction is the first direction or the second direction;
a magnetism of a pole of the first magnet facing the electromagnet is opposite to that of a pole of the second magnet facing the electromagnet;
when the electromagnet is magnetized by a current in a third direction generated by the mainboard, an attraction in the first direction is present between the electromagnet and the first magnet, and a repulsion in the first direction is present between the electromagnet and the second magnet; and
when the electromagnet is magnetized by a current in a fourth direction generated by the mainboard, a repulsion in the second direction is present between the electromagnet and the first magnet, and an attraction in the second direction is present between the electromagnet and the second magnet;
wherein the third direction is opposite to the fourth direction.

13. The terminal according to claim 12, wherein the slide rail assembly comprises a sliding rail disposed on the front panel, and a sliding plate disposed on the mainboard or connected to the mainboard; and the sliding rail is connected to the sliding plate, and the front slider is disposed on the sliding plate;
wherein the front slider is configured to slide from the first position to the second position or from the second position to the first position by sliding of the sliding plate relative to the sliding rail.

14. The terminal according to claim 12, further comprising a Hall element comprising a Hall sensor connected to the mainboard, and a third magnet, wherein
the Hall sensor is disposed in the front slider, and the third magnet is disposed in the front panel; or the Hall sensor is disposed in the front panel, and the third magnet is disposed in the front slider;
the Hall sensor is configured to generate a first triggering signal and report the first triggering signal to the mainboard when it is determined according to the third magnet that the front slider is slid relative to the front panel; and
the mainboard is configured to generate a current in the third direction according to the first triggering signal, and output the current in the third direction to the electromagnet when a sliding direction of the front slider relative to the front panel is the first direction; or configured to generate a current in the fourth direction according to the first triggering signal, and output the current in the fourth direction to the electromagnet when the sliding direction of the front slider relative to the front panel is the second direction.

15. The terminal according to claim 12, further comprising a Hall element comprising a Hall sensor and a third magnet, wherein
the Hall sensor is disposed in the front slider, and the third magnet is disposed in the front panel; or the Hall sensor is disposed in the front panel, and the third magnet is disposed in the front slider;
the Hall sensor is configured to generate a second triggering signal and report the second triggering signal to the mainboard when it is determined according to the third magnet that the front slider is slid relative to the front panel;

when a first application is running and an launching request of a second application is received by the mainboard, the mainboard is configured to launch the second application according to the launching request, permit the second application to call the front element according to the second triggering signal, and display the first application in a first region and the second application in a second region; wherein the first region and the second region are obtained by dividing the display screen.

16. A controlling device of a front assembly sliding structure, used in a terminal, wherein the terminal comprises: a front panel provided with a display screen; a rear panel provided with a mainboard; and the front assembly sliding structure connected to the front panel and the rear panel, respectively, and comprising: a front slider provided with a first magnetic body; and a second magnetic body disposed on the front panel, wherein the front slider is slidable relative to the front panel, the first magnetic body is opposite to the second magnetic body when the front slider is in a first position, the controlling device comprising:
a processor; and
a memory for storing instructions executable by the processor,
wherein the processor is configured to:
receive a control instruction;
control that a force in a first direction is present between the first magnetic body and the second magnetic body according to the control instruction, so as to enable the front slider to slide from the first position to a second position; and
control that a force in a second direction is present between the first magnetic body and the second magnetic body according to the control instruction, so as to enable the front slider to slide from the second position to the first position;
wherein the first direction is opposite to the second direction; the first position is a position where the front element in the front slider is shielded by the front panel; and the second position is a position where the front element in the front slider is not shielded by the front panel.

17. The controlling device according to claim 16, wherein when the first magnetic body is an electromagnet, and the second magnetic body comprises a first magnet and a second magnet; or the first magnetic body comprises a first magnet and a second magnet, and the second magnetic body is an electromagnet, the processor is further configured to:
generate a current in a third direction according to the control instruction to magnetize the electromagnet, such that an attraction in the first direction is present between the magnetized electromagnet and the first magnet, and a repulsion in the first direction is present between the magnetized electromagnet and the second magnet.

18. The controlling device according to claim 17, wherein the processor is further configured to:
generate a current in a fourth direction according to the control instruction to magnetize the electromagnet, such that a repulsion in the second direction is present between the magnetized electromagnet and the first magnet, and an attraction in the second direction is present between the magnetized electromagnet and the second magnet;
wherein the third direction is opposite to the fourth direction.

19. The controlling device according to claim 18, wherein when the front assembly sliding structure further comprises a Hall element including a Hall sensor and a third magnet, the processor is further configured to:
receive a first triggering signal reported by the Hall sensor, wherein the first triggering signal is generated by the Hall sensor when it is determined according to the third magnet that the front slider is slid relative to the front panel;
generate the current in the third direction, and output the current in the third direction to the electromagnet when it is determined according to the first triggering signal that a sliding direction of the front slider is the first direction; or
generate the current in the fourth direction and output the current in the fourth direction to the electromagnet when it is determined according to the first triggering signal that the sliding direction of the front slider is the second direction.

20. The controlling device according to claim 16, wherein when the front assembly sliding structure further comprises a Hall element including a Hall sensor and a third magnet, the processor is further configured to:
receive a second triggering signal reported by the Hall sensor, wherein the second triggering signal is generated by the Hall sensor when it is determined according to the third magnet that the front slider is slid relative to the front panel;
launch a second application according to a launching request when a first application is running and the launching request of the second application is received,
permit the second application to call the front element according to the second triggering signal, and
display the first application in a first region and the second application in a second region;
wherein the first region and the second region are obtained by dividing the display screen of the terminal.

* * * * *